United States Patent [19]
Ahn

[11] Patent Number: 5,939,990
[45] Date of Patent: Aug. 17, 1999

[54] METHOD OF INDICATING OPERATION OF BACKUP BATTERY AND CIRCUIT FOR SENSING THE SAME

[75] Inventor: Kwang-Jin Ahn, Gumi, Rep. of Korea

[73] Assignee: SamSung Electronics Co., Ltd., Suwon, Rep. of Korea

[21] Appl. No.: 08/784,811

[22] Filed: Jan. 16, 1997

[30] Foreign Application Priority Data

Jan. 16, 1996 [KR]  Rep. of Korea ............................ 96/742

[51] Int. Cl.⁶ ................................................... G08B 21/00
[52] U.S. Cl. ........................ 340/636; 324/426; 320/134; 320/136; 250/200
[58] Field of Search ..................... 340/636, 635; 324/435, 426, 429; 320/134, 136; 250/200, 201.1, 206, 215; 361/100

[56] References Cited

U.S. PATENT DOCUMENTS

| | | |
|---|---|---|
| 4,882,782 | 11/1989 | Kimizuka et al. ...................... 361/100 |
| 5,047,961 | 9/1991 | Simonsen ................................. 364/550 |
| 5,122,751 | 6/1992 | Aita et al. . |
| 5,252,710 | 10/1993 | Landau ....................................... 429/50 |
| 5,454,710 | 10/1995 | Landau et al. . |
| 5,473,262 | 12/1995 | Yoshimatsu . |
| 5,525,439 | 6/1996 | Huhndorff et al. . |
| 5,528,149 | 6/1996 | Chen . |
| 5,549,984 | 8/1996 | Dougherty . |

*Primary Examiner*—Jeffery A. Hofsass
*Assistant Examiner*—Julie B. Lieu
*Attorney, Agent, or Firm*—Robert E. Bushnell, Esq.

[57] ABSTRACT

A circuit and a method of indicating the operation of a backup battery used in a communication device use a sensing circuit. The sensing circuit includes a diode connected in the forward direction between the communication device and the backup battery, for forming a current path from the communication device to the backup battery. A photocoupler connects in the forward direction between the backup battery and the communication device, for forming a current path from the backup battery to the communication device and sensing an output voltage from the backup battery. When the backup battery is operated, such a situation is sensed and the user is informed.

25 Claims, 2 Drawing Sheets

METHOD OF INDICATING OPERATION OF BACKUP BATTERY AND CIRCUIT FOR SENSING THE SAME

CLAIM OF PRIORITY

This application refers to, incorporates the same herein, and claims all benefits accruing under 35 U.S.C. § 119 from an application for METHOD OF INDICATING OPERATION OF BACKUP BATTERY AND CIRCUIT FOR SENSING THE SAME earlier filed in the Korean Industrial Property Office on the 16$^{th}$ day of January 1996 and there duly assigned Serial No. 742/1996.

BACKGROUND OF THE INVENTION

1. Field of the Invention

The present invention relates generally to electrical equipment and process using backup batteries, and more particulary, to processes and circuits indicating the operation of a backup battery used in a electrical equipment, such as a communication equipment, and a circuit for sensing the operation.

2. Description of the Prior Art

Typically, a backup battery is used in an electrical equipment to automatically supply power to the equipment when external power supply is cut off or the equipment is plugged out. This is especially true for an communication equipment. Unless a communication equipment always has a power source, communications that had been transmitted may be forever lost. Further, during emergencies, this may be dangerous to human lives that depend on information that are transmitted and received from the communication equipment. When a backup battery is being used for a communication equipment, a user cannot know that the communication equipment is being operated by the backup battery. As a result, the user cannot recognize the external power interruption, which may simply be treated, until the communication equipment is stopped in operation as electricity charged in the backup battery is completely exhausted. Thus an indicator of a use of the backup battery is useful.

On this matter, an exemplar of the contemporary practice, Dougherty, U.S. Pat. No. 5,549,984, Control And Indicator Circuit For A Dual Battery System, issued on the 27$^{th}$ day of August 1996, discusses a battery backup or dual battery system and particularly discusses a control circuit for switching between the battery switch in a dual battery system. Another exemplar. Chen, U.S. Pat. No. 5,528,149, Test Circuit For Back-Up Battery, issued on the 18$^{th}$ day of June 1996. discusses a test circuit for a back-up battery which includes a main switch which connects a main power source to a load, and a diode which is interposed between a back-up battery and the load. Huhndorff el al., U.S. Pat. No. 5,525,439, Battery Voltage Tester For End Of Cell Having Indicator Disposed On Battery Side, issued on the 11$^{th}$ day of June 1996, discusses a battery with an end-of-cell voltage indicating device which can be used to indicate the state-of-charge of the battery. The indicating device has a flexible substrate of the same peripheral configuration as the battery. Yoshimatsu, U.S. Pat. No. 5,473,262, Power Source Residual Capacity Measuring Apparatus And Power Source Apparatus Having Power Source Capacity Measuring Circuit, issued on the 5$^{th}$ day of December 1995, discusses a power source residual capacity measuring apparatus which comprises a circuit for measuring a residual capacity of a power source, a circuit for detecting a current flowing in a load connected to the power source, and a circuit for correcting the residual capacity of the power source which was measured by the measuring circuit. Landau et al., U.S. Pat. No. 5,454,710, for a Display System For A Battery Monitoring Circuit, issued on the 3$^{rd}$ day of October 1995, discusses rechargeable batteries, especially a circuitry for controlling the charging operation and monitoring the parameters of the battery during and after the recharging of operation. Aita et al., U.S. Pat. No. 5,122,751, for a Device For Detecting Residual Capacity Of A Battery Both In Load And No Load Conditions, issued on the 16$^{th}$ day of June 1992, discusses a device for detecting and displaying residual capacity of a battery which comprises a comparator comparing detection voltages set to predetermined values and open circuit voltage. From the study of these exemplars of the contemporary practice and of the prior art, I find that there is a need for an effective and improved sensing circuit and a method of using such a sensing circuit to indicate use of a backup battery, as in the particulars of the present invention.

SUMMARY OF THE INVENTION

Therefore, it is an object of the present invention to provide an improved process and electrical circuit for using a backup battery.

It is a further object of the present invention to provide an improved process and circuit for indicating the operation of a backup battery used in a electrical equipment, such as a communication equipment, and a circuit for sensing the operation.

It is an object of the present invention to provide an improved process and a circuit for sensing the operation of a backup battery and informing the user of the sensed result.

In accordance with one or more of the above objects, there is provided a process and sensing circuit connected between a communication device and a backup battery to indicate that the communication device is being operated by the backup battery. The sensing circuit may include a diode connected in the forward direction between the communication device and the backup battery, for forming a current path from the communication device to the backup battery. A photocoupler is connected in the forward direction between the backup battery and the communication device, for forming a current path from the backup battery to the communication device and sensing an output voltage from the backup battery. An indication circuit is responsive to the sensed voltage from the photocoupler, for indicating that the backup battery is being driven.

In accordance with another aspect of the present invention, there is provided a process for indicating an operation of a backup battery used in a communication device, including the steps of informing the user of the operation of the backup battery using a circuit which is connected between the communication device and the backup battery to sense and indicating the operation of the backup battery.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
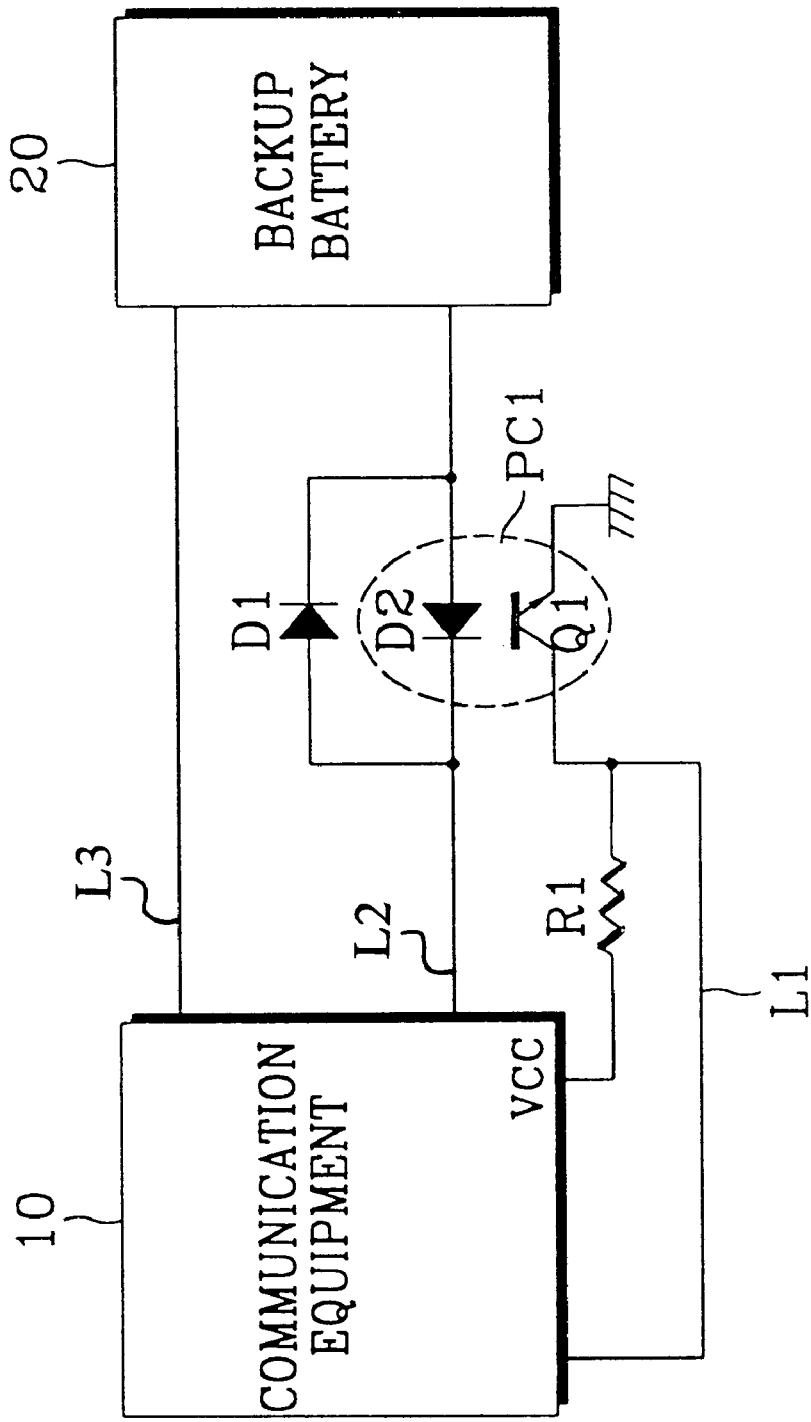
FIG. 1 is a circuit diagram illustrating a circuit for sensing the operation of a backup batter), built in accordance with the principles of the present invention.
Figure 2:
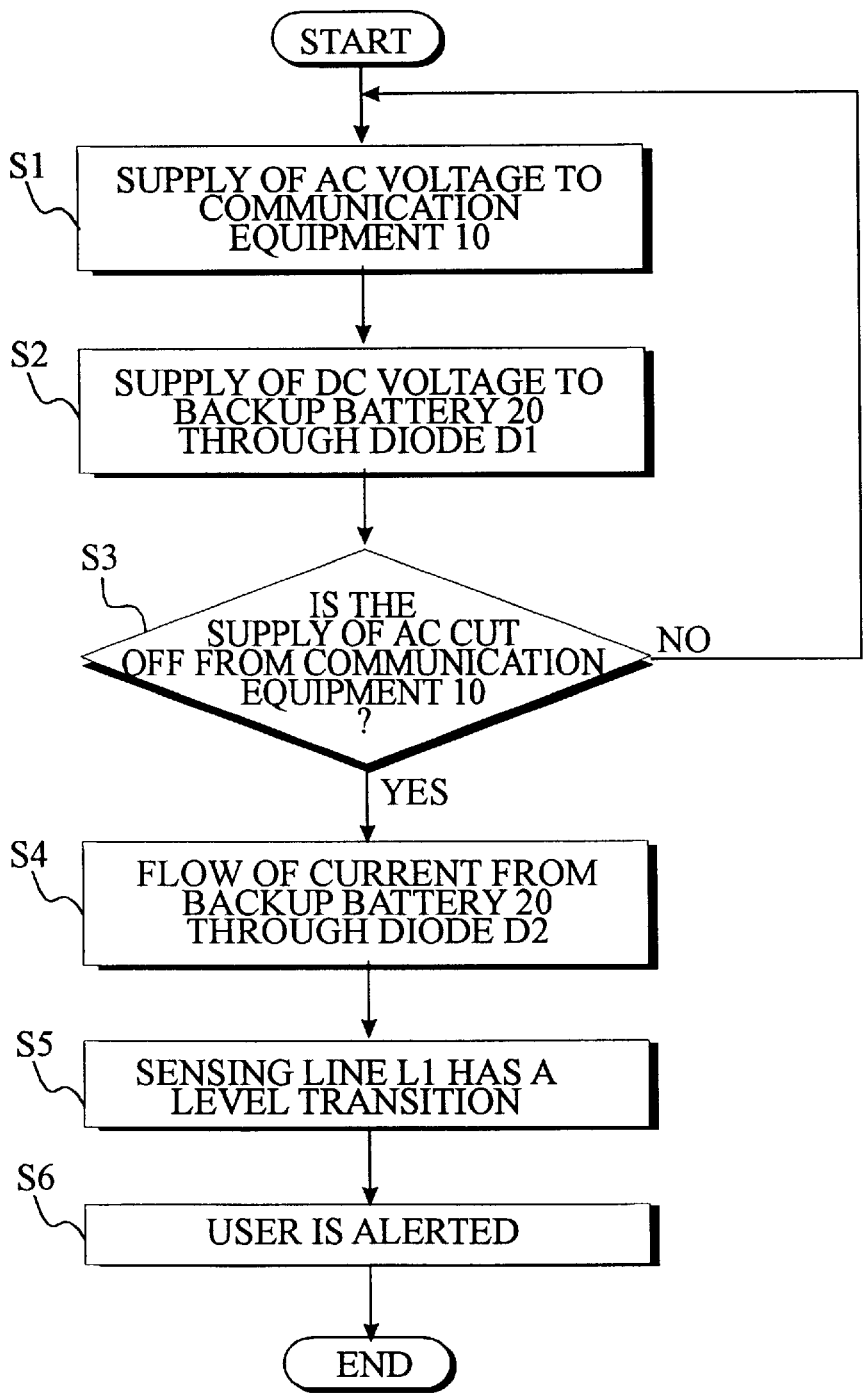
FIG. 2 is a flow chart illustrating charging and operation of the circuit illustrated in FIG. 1.

Turning now to the drawings, FIG. 1 is a circuit diagram illustrating the construction of a circuit for sensing the operation of a backup battery in accordance with the present invention. The backup battery is designated by the reference numeral 20 herein. As shown in this drawing of FIG. 1, the sensing circuit includes a diode D1 connected in the forward direction between communication equipment 10 and the backup battery 20 to form a current path from the communication equipment 10 to the backup battery 20. The backup battery 20 and the communication equipment 10 are connected via lines L2 and L3. The backup battery 20 is attached to lines L2 and L3, by terminals 22 and 23 respectively. The communication equipment 10 is attached to lines L2 and L3, by terminals 12 and 13 respectively. The communication equipment 10 is attached to another power source by a connection such as a plug 15. A photocoupler PC1 is connected in the forward direction between the backup battery 20 and the communication equipment 10 to form a current path from the backup battery 20 to the communication equipment 10 and to sense an output voltage from the backup battery 20, and an indication circuit 14 is responsive to the sensed voltage from the photocoupler PC1, for indicating that the backup battery 20 is being driven. The photocoupler PC1 includes a light emitting diode D2 connected in the reverse direction to the diode D1, and a bipolar transistor Q1 being driven by light emitted by the light emitting diode D2. The bipolar transistor Q1 has its collector connected to a supply voltage terminal VCC through a resistor R1 and its emitter connected to a ground voltage terminal. The sensed voltage from the photocoupler PC1 is transferred through the collector of the bipolar transistor Q1 to the indication circuit, which is used in the communication equipment 10.

The following describes, in detail, the operation of the above mentioned sensing circuit. At step S1, upon inputting a normal alternating current (AC) voltage the communication equipment 10 outputs a direct current (DC) voltage. Then, at step S2, the direct current voltage is supplied to the backup battery 20 through the diode D1. This charges the backup battery. At this time, an output line or sensing line L1 of the photocoupler PC1 becomes high in level. At step S3, in the case where the AC voltage to the communication equipment 10 is cut off due to, for example, external power interruption, a power line of the communication equipment 10 is automatically connected to the backup battery 20. As a result, at step S4, current from the backup battery 20 flows to the communication equipment 10 through the diode D2 in the photocoupler PC1.

At step S5, when current flows through the diode D2 in the photocoupler PC1 in the forward direction, the output line or sensing line L1 of the photocoupler PC1 goes from high to low in level. At this time, the communication equipment 10 senses the level transition of the output line or sensing line L1 of the photocoupler PC1. Thus, at step S6, the communication equipment 10 informs the user that the backup battery 20 is being driven, through various methods such as, for example, an alarm beep, lamp, liquid crystal display, or other device providing a variable visual display.

As apparent from the above descriptions, when the backup battery is operated, such a situation is sensed and the user is informed. Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A sensing circuit, comprising:

a power line having first, second, third, and fourth terminals, said first and second terminals connectable to a backup battery connectable to an electrically driven device, said third and fourth terminals connected to said electrically driven device, said power line automatically connecting said backup battery to said electrically driven device upon occurrence of an interruption of power supplied to said electrically driven device;

a first diode having a first anode and a first cathode, said first cathode connected to said electrically driven device, said first anode connectable to said backup battery;

a photocoupler connected to a reference potential and connected between said backup battery and said electrically driven device, said photocoupler sensing an output voltage from said backup battery and generating a sensed voltage signal representing said output voltage;

a resistor connected between a supply voltage of said electrically driven device and said photocoupler;

a sensing line connected between said photocoupler and said electrically driven device, said sensing line conveying the sensed voltage signal from said photocoupler to said electrically driven device; and an indication circuit receiving the sensed voltage signal from said photocoupler, said indicating circuit announcing, in dependence upon the sensed voltage signal, discharging of said backup battery.

2. The sensing circuit of claim 1, with said photocoupler comprising:

a light emitting diode having a second anode and a second cathode, said second anode connected to said backup battery and said second cathode connected to said electrically driven device; and a bipolar transistor being turned on by said light emitting diode.

3. The sensing circuit of claim 2, with said bipolar transistor comprises:

a collector connected to said ground, and an emitter connected to said resistor, said emitter conveying the sensed voltage signal to said sensing line.

4. The sensing circuit of claim 3, with said indication circuit comprising a beep alarm.

5. The sensing circuit of claim 3, with said indication circuit comprising a lamp.

6. The sensing circuit of claim 3, with said indication circuit comprising a liquid crystal display.

7. The sensing circuit of claim 1, with said backup power supplying power to said electrically driven device when an external power supply of said electrically driven device is cut off from said electrically driven device.

8. The sensing circuit of claim 1, with said electrically driven device being a communication equipment.

9. The sensing circuit of claim 1, with said photocoupler comprising a bipolar transistor.

10. The sensing circuit of claim 1, with said photocoupler comprising a light emitting diode.

11. The sensing circuit of claim 1, with said photocoupler comprising a phototransistor.

12. A method of using a sensing circuit to indicate an operation of a backup battery, said method comprising the steps of:
   raising a sensed voltage level of a sensing line to a high level, said sensing line connecting a photocoupler and an electrically driven device;
   when an alternating current voltage source supplying power to said electrically driven device is cut off, connecting a power line of said electrically driven device to said backup battery;
   supplying current from said backup battery to a light emitting diode of said photocoupler;
   when current flows through said light emitting diode, lowering the sensed voltage level of said sensing line to a low level;
   when said electrically driven device senses the lowering of the sensed voltage level, an indication circuit informing a user of operation of said backup battery.

13. The method of claim 12, with said light emitting diode comprising:
   a second anode connected to said backup battery; and
   a second cathode connected to said electrically driven device.

14. The method of claim 12, with said photocoupler further comprising a bipolar transistor being turned on by said light emitting diode.

15. The sensing circuit of claim 14, with said bipolar transistor comprising
   a collector connected to said ground; and
   an emitter connected to a supply voltage source of said electrically driven device via a resistor, said emitter conveying the sensed voltage signal to said sensing line.

16. The sensing circuit of claim 12, with said indication circuit comprising a beep alarm.

17. The sensing circuit of claim 12, with said indication circuit comprising a lamp.

18. The sensing circuit of claim 12, with said indication circuit comprising a liquid crystal display.

19. The sensing circuit of claim 12, with said electrically driven device being a communication equipment.

20. The method of claim 12, with said backup battery being charged by:
   supplying an alternating current voltage to said electrically driven device;
   converting said alternating current voltage to a direct current voltage; and supplying a direct current voltage to said backup battery.

21. A sensing circuit, comprising:
   a diode connected in a first forward direction of electrical current flow between a communication device and a backup battery, said diode forming a first current path from said communication device to the backup battery;
   a photocoupler connected in a second and opposite forward direction of current flow between said backup battery and said communication device, said photocoupler forming a second current path from the backup battery to said communication device and sensing an output current from the backup battery; and
   an indication circuit sensing the output current sensed by said photocoupler, said indicating circuit announcing discharging of the backup battery.

22. The sensing circuit of claim 1, wherein said photocoupler comprises:
   a light emitting diode connected in a forward direction between said backup battery and said communication device; and
   a bipolar transistor being turned on by said light emitting diode.

23. The sensing circuit of claim 1, wherein said indication circuit comprises a beep alarm.

24. The sensing circuit of claim 1, wherein said indication circuit comprises a lamp.

25. The sensing circuit of claim 1, wherein said indication circuit comprises a liquid crystal display.

\* \* \* \* \*